United States Patent [19]

McDougall

[11] 4,028,488
[45] * June 7, 1977

[54] SUPERCONDUCTORS

[75] Inventor: Ian Leitch McDougall, Aldridge, England

[73] Assignee: Imperial Metal Industries (Kynoch) Limited, Birmingham, England

[ * ] Notice: The portion of the term of this patent subsequent to Apr. 8, 1992, has been disclaimed.

[22] Filed: Jan. 16, 1975

[21] Appl. No.: 541,648

[30] Foreign Application Priority Data

Jan. 28, 1974 United Kingdom .............. 3830/74

[52] U.S. Cl. .......................... 174/128 S; 174/126 S
[51] Int. Cl.$^2$ ......................................... H01B 12/00
[58] Field of Search ..................... 174/126 S, 128 S

[56] References Cited

UNITED STATES PATENTS 3,876,473  4/1975  McDougall .................... 174/126 S Primary Examiner—E. A. Goldberg
Attorney, Agent, or Firm—Cushman, Darby & Cushman

[57] ABSTRACT

A mechanically strengthened intermetallic superconductor formed around filaments of one component of the superconductor in a matrix material. The selection of specified relative proportions for the components of the assembly leads to enhanced mechanical properties of the superconductor in the composite.

10 Claims, 2 Drawing Figures

SUPERCONDUCTORS

BACKGROUND OF THE INVENTION

This invention relates to superconductors, and has particular reference to intermetallic superconductors.

It has been proposed to manufacture superconductors of intermetallic compounds such as $Nb_3Sn$. Unfortunately, such compounds are very brittle, and tend to break when subjected to strain. Consequently, proposals have been made to manufacture a precursor structure comprising niobium and tin, or the other components of the eventual intermetallic superconductor in the unreacted state on a support. The precursor is then manufactured into a solenoid, and the solenoid heated to a temperature sufficiently high to cause a reaction between the components to form the intermetallic compound. This causes problems, in that the whole solenoid has to be heated, which is obviously inconvenient, since, for example, distortion of the winding can occur. Also, the resultant structure is fragile, and the high loads imposed on it, as a result of the magnetic fields produced, during use, can cause sufficient strain to lead to breakage of the intermetallic compound.

Superconducting composites including filamentary intermetallic compounds in which the intermetallic compound is reacted prior to the winding of the solenoid offer advantages in terms of handling and uniformity of superconducting properties, but would be unsatisfactory if the composite structure was too brittle.

As a result of observations of a large number of different structures, it has unexpectedly been found that the degree of apparent brittleness in composite intermetallic superconductors can be reduced by particular physical arrangements of the component parts of the composite.

SUMMARY OF THE INVENTION

By the present invention there is provided a composite superconductor assembly comprising a plurality of filaments of one component of a superconductive intermetallic compound embedded in a matrix material of a material which is non-superconductive at 5° K, there being a layer of the superconductive compound on the filaments, characterised in that the filaments have a diameter in the range of 0.0005 to 0.0020 cm diameter, and the layer of superconductive compound has a thickness in the range 0.00005 to 0.0002 cm.

The filaments may be of niobium, and the non-superconductive material may be copper or a copper-tin alloy.

The filaments are preferably as large as possible, and the thickness of the superconductive intermetallic compound is preferably as small as possible. Preferably the interfilament distance is less than the diameter of the filaments. The filaments may have a diameter in the range 0.0005 to 0.0015 cm, and superconductive compound may be in the range 0.00005 to 0.0001 cm thick.

There may be a core of a further metal in the filaments. There may be a plurality of metals in the core.

The composite assembly may include a diffusion barrier partway through the filaments, the diffusion barrier being a cylindrical diffusion barrier so that there is an inner core and an outer sheath of the one component separated by the diffusion barrier.

The matrix material may include a stabilising material and the remaining component or components of the intermetallic superconductive compound.

Preferably the Poisson's ratio of the matrix is less than the Poisson's ratio of the filament material, such that, in tension, the intermetallic compound is subjected to tension along three mutually perpendicular axes due to the tendency of the filament to shrink from the matrix.

The present invention also provides a composite superconductor assembly comprising a plurality of filaments of one component of a superconductive intermetallic compound embedded in a matrix material of a material which is non-superconductive at 5° K, there being a layer of the superconductive compound on the filaments, characterised in that the superconductive intermetallic compound is subjected to tension along three mutually perpendicular axes when the composite assembly is in tension, and that the composite is undamaged by 2% engineering strain.

The filaments may have a thickness of 0.0006 to 0.0010 cm diameter and the ratio of amount of matrix material to filament material may be in the range 3:1 to 1:1; the layer of superconductive intermetallic compound may be in the range 0.00005 to 0.00020 cm, preferably 0.00010 cm thick.

BRIEF DESCRIPTION OF THE DRAWINGS

By way of example, embodiments of the present invention will now be described with reference to the accompanying drawings of which.

DESCRIPTION OF THE PREFERRED EMBODIMENTS

Figure 1:
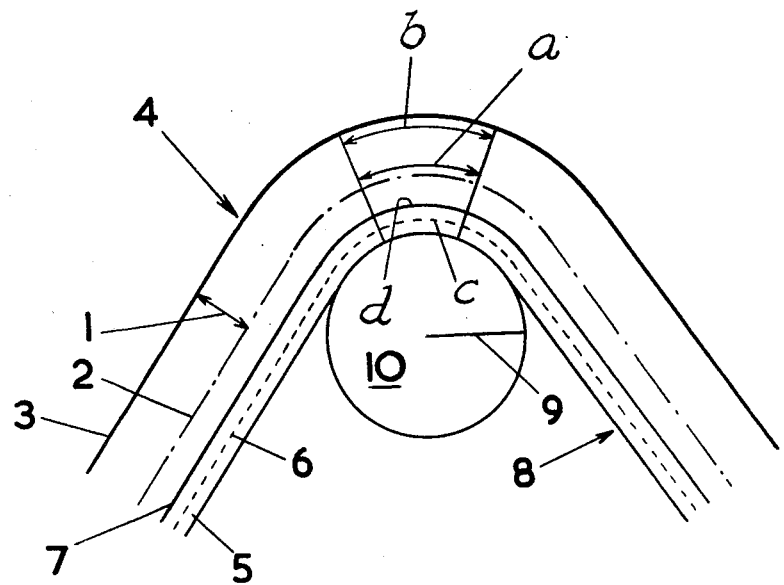
FIG. 1 is a cross-section of a filament and former.

Intermetallic superconductors have been proposed in which filaments of an intermetallic compound are formed in situ in a matrix material. These filaments are normally of a very small diameter. Because intermetallic compounds are very brittle, it has been suggested that the wire diameter be as small as possible and it would be expected that the smaller the diameter the filaments, the more resistant to breakage. When bending the filaments around a constant external radius, the smaller the diameter of the filaments, the lower the difference in strain between the inside and outside radii of the filaments. The distance 1 between the neutral axis 2 and the external surface 3 of the large wire 4 is greater than the distance 5 between the neutral axis 6 and the external surface 7 of the superimposed wire 8. Both wires are being bent around a constant radius 9 of the former 10. Thus the strain at the surface of the large diameter wire 4 is b-a/a and the strain at the surface of the small diameter wire 8 is d-c/c. It can be seen from FIG. 1 tha b-a/a is greater than d-c/c.

It would be expected, therefore, that by reducing the thickness of the filaments and the wire diameter, composite multifilament wires comprising intermetallic filaments in a non-superconductive matrix would be made more resistant to damage by strain. In a series of experiments, composite wires including intermetallic filaments of $Nb_3Sn$ in a bronze matrix were prepared, and the resistance to breakage of the filaments was tested. Filaments 10 microns thick (0.001 cm) were undamaged by 2% engineering strain (in terms of the wire 4 of FIG. 1 b-a/a = 2%). However, filaments 6 microns in diameter were damaged by 2% engineering strain. These results are the complete reverse of those which would be expected following the teachings immediately above.

Analysis of the system showed that in both cases the intermetallic compound was in the form of a layer of the order of one micron thick on an otherwise unreacted niobium core.

An investigation of such a structure indicates that the factors which are involved are the filament diameter, the thickness of the intermetallic layer, and the interfilament distance. For maximum mechanical strength, the filament diameter should be as large as possible, and both the intermetallic layer thickness and the interfilament distance should be as small as possible.

It has also been realised that the principle of support of the niobium tin in composites arises from the difference in Poisson's ratio between the filament, the niobium tin and the matrix materials. Taking a wire and applying a stress or load to the wire axis results in a strain in that direction with a strain normal to the wire axis due to Poisson effect. The magnitude of the strain normal to the wire axis is different for each material in the composite. Therefore, a thin layer of compound at the matrix filament interface will be strained if the composite is to remain "glued" together. A stress will be induced in the compound layer normal to the applied wire stress. As a consequence the shear stresses in the compound which cause the shape change and subsequent fracture will be reduced provided that the principal stresses in the compound are of the same sign. For a wire loaded in tension this requires the niobium tin to tend to shrink away from the niobium and bronze; a situation which is achieved as the Poisson's ratio of 10% bronze is about 0.34, that of niobium is about 0.38 while that of niobium tin is about 0.33. This assumes that no deformation of the matrix or filament occurs in the direction normal to wire axis due to the stress induced in the compound, ie the compound is not stronger than the matrix or filament.

To show the effect of the diameter of the filament on the mechanical properties of the composite, a series of experiments was made. Composites were manufactured in which the final products were in the form of niobium filaments surrounded by superconductive $Nb_3Sn$ in a bronze matrix. In these composites, the thickness of the $Nb_3Sn$ was 1 micron, the diameter of the wire was as set out below, and the diameter of the filament was the diameter of the unreacted niobium core.

The composites were prepared and reacted to form products of the type set out in the paragraph above. One of the composites was then tested for its current-carrying abilities in a series of magnetic fields in the undeformed state. The wire was then bent around a 1cm diameter former and retested. In the following table the bent wires refers to those tests made after the wires had been deformed by bending around the former, and the as-reacted wires refers to those in the unbent form. In each case, the ability of the wire to carry current at a series of fields was tested, and the following results were obtained:

Table 1

| | CURRENT (AMPS) | | | | | |
|---|---|---|---|---|---|---|
| | Wire Diameter 0.23mm | | Wire Diameter 0.25mm | | Wire Diameter 0.28mm | |
| | Filament Diameter 4.9μm | | Filament Diameter 5.4μm | | Filament Diameter 6.0μm | |
| FIELD (TESLA) | Bent | As reacted | Bent | As reacted | Bent | As reacted |
| 2 | 18 | 176 | 44 | 156 | 95 | 124 |
| 3 | 15 | 83 | 33 | 154 | 73 | 95 |
| 4 | 13 | 64 | 25 | 66 | 55 | 76 |
| 5 | 8 | 60 | 20 | 58 | 47 | 58 |
| 6 | 6 | 46 | 18 | 48 | 40 | 48 |

It can be seen that the larger the filament diameter, the less the degradation of the current-carrying ability of the wire following bending. This is particularly clear when comparing the 4.9 microns diameter filaments with the 6 microns diameter filaments. In the first case, as a field of 2 Tesla, there is a reduction in properties of almost 90% whereas in the second case the reduction in properties is only about 25%. At 6 Tesla, the reduction in the first case is about 85% whereas the reduction in the second case is only about 15%.

Figure 2:
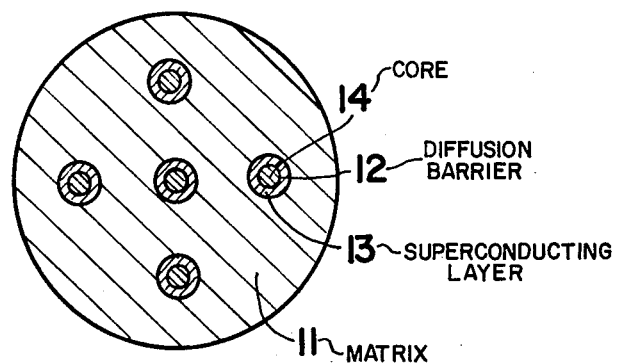
FIG. 2 is a cross-section of a composite assembly.

To produce intermetallic compounds of the required thickness, it may be advisable to use a tantalum diffusion barrier part-way through the niobium filaments. In such an arrangement, a series of niobium rods would be sheathed with tantalum and an outer layer of niobium and inserted into a bronze sheath. The rods would then be stacked in a bronze can which would be evacuated and sealed and subsequently heated and extruded. With reference to FIG. 2 the composite product would then be heated to an elevated temperature of the order of 8° to 900° C so that the tin would diffuse from the bronze 11 onto the outer niobium layer until it reached the tantalum 12, reacting with the niobium to form $Nb_3Sn$ 13. The tantalum would prevent the tin passing any further, and would thus define the $Nb_3Sn$ more accurately. The inner core 14 of niobium could be replaced with any other material having a similar Poisson's ratio.

In addition to the effect of filament size, it has been discovered that the ratio of matrix to filament should be kept as low as possible, for example if the ratio of bronze to niobium in the starting precursor is 3:1, six microns diameter filaments are damaged by 2% strain whereas if the ratio of bronze to niobium is 2:1, six microns diameter filaments are unaffected by 3% strain. It is believed that adjacent filaments act to support one another resulting in the increased mechanical strength of the composite.

I claim:

1. A composite superconductor assembly comprising a plurality of filaments of one component of a superconductive intermetallic compound embedded in a matrix material of a material which is non-superconductive at 5° K, there being a layer of the superconductive compound on the filaments, characterised in that the filaments have a diameter in the range 0.0005 to 0.0020 cm, and the layer of superconductive compound has a thickness in the range 0.00005 to 0.0002 cm and the interfilament distance is less than the diameter of the filaments.

2. A composite superconductor assembly comprising a plurality of filaments of one component of a superconductive intermetallic compound embedded in a matrix material of a material which is non-superconductive at 5° K, there being a layer of the superconductive compound on the filaments, characterised in that the filaments have a diameter in the range 0.0005 cm to 0.0020 cm, the layer of superconductive compound has a thickness in the range 0.00005 to 0.0002 cm and in that there is a cylindrical diffusion barrier located within the filament, so that there is an inner core and an outer sheath of the one component separated by the diffusion barrier.

3. A composite as claimed in claim 2 in which the filaments have a diameter in the range 0.0005 to 0.0015 cm and the superconductive compound has a thickness in the range 0.00005 to 0.0001 cm.

4. A composite as claimed in claim 2 in which the interfilament distance is less than the diameter of the filaments.

5. A composite as claimed in claim 2 in which the filaments are niobium filaments and in which the non-superconductive material is chosen from the group copper or a copper-tin alloy.

6. A composite as claimed in claim 2 in which some at least of the filaments have a core of a further metal.

7. A composite as claimed in claim 6 in which there are a plurality of metals in the core.

8. A composite as claimed in claim 2 in which the Poisson's ratio of the matrix material is less than the Poisson's ratio of the filament material, such that, in tension, the intermetallic compound is subjected to tension along three mutually perpendicular axes due to the tendency of the filament to shrink from the matrix.

9. A composite as claimed in claim 2 in which the filaments have a thickness in the range 0.0006 to 0.001 cm diameter, the superconductive intermetallic compound being in the range 0.00005 to 0.0001 cm thick.

10. A composite as claimed in claim 9 in which the ratio of the amount of matrix material to filament material is in the range 3:1 to 1:1.

* * * * *